United States Patent
Murin

(10) Patent No.: US 8,020,060 B2
(45) Date of Patent: Sep. 13, 2011

(54) METHOD OF ARRANGING DATA IN A MULTI-LEVEL CELL MEMORY DEVICE

(75) Inventor: Mark Murin, Kfar Saba (IL)

(73) Assignee: SanDisk IL Ltd, Kfar Saba (IL)

(*) Notice: Subject to any disclaimer, the term of this patent is extended or adjusted under 35 U.S.C. 154(b) by 1217 days.

(21) Appl. No.: 11/623,328

(22) Filed: Jan. 16, 2007

(65) Prior Publication Data

US 2007/0180346 A1   Aug. 2, 2007

Related U.S. Application Data

(60) Provisional application No. 60/759,396, filed on Jan. 18, 2006.

(51) Int. Cl.
 *H04L 1/00* (2006.01)
 *G08C 25/00* (2006.01)
 *H03M 13/00* (2006.01)
 *G06F 11/30* (2006.01)

(52) U.S. Cl. .......... 714/746; 714/763; 714/800

(58) Field of Classification Search .......... 714/746, 714/758, 762, 788, 763, 800; 711/157
 See application file for complete search history.

(56) References Cited

U.S. PATENT DOCUMENTS

| 5,051,889 | A  | * | 9/1991 | Fung et al. ............. 711/157 |
| 6,628,544 | B2 | * | 9/2003 | Shum et al. ............. 365/185.03 |
| 6,847,554 | B2 |   | 1/2005 | Satori |
| 2006/0101193 | A1 |   | 5/2006 | Murin |

OTHER PUBLICATIONS

W. Wesley Peterson, EJ Weldon, Jr. "*Error-correcting Codes*", Second Ed., The Massachusetts. Institute of Technology, 1972.
EPO/ISA, "Notification of Transmital of the International Search Report and the Written Opinion of the International Searching Authority, or the Declaration," corresponding International Application No. PCT/IL07/00061, mailed on Oct. 27, 2008, 8 pages.

* cited by examiner

*Primary Examiner* — Guy J Lamarre
(74) *Attorney, Agent, or Firm* — Davis Wright Tremaine LLP

(57) ABSTRACT

A method of storing data includes storing a first portion of data in bit positions of a non-volatile memory having a first probability of error; storing a second portion of the data in bit positions of the non-volatile memory having a second probability of error, wherein the second probability of error is lower than the first probability of error; storing error correction parity bits with the data; and applying an error correction scheme to read data using the error correction parity bits, wherein at least one bit of the first portion is checked for correction before any bit of the second portion is checked for correction. The error correction scheme is stopped before checking for correcting of all the data.

15 Claims, 2 Drawing Sheets

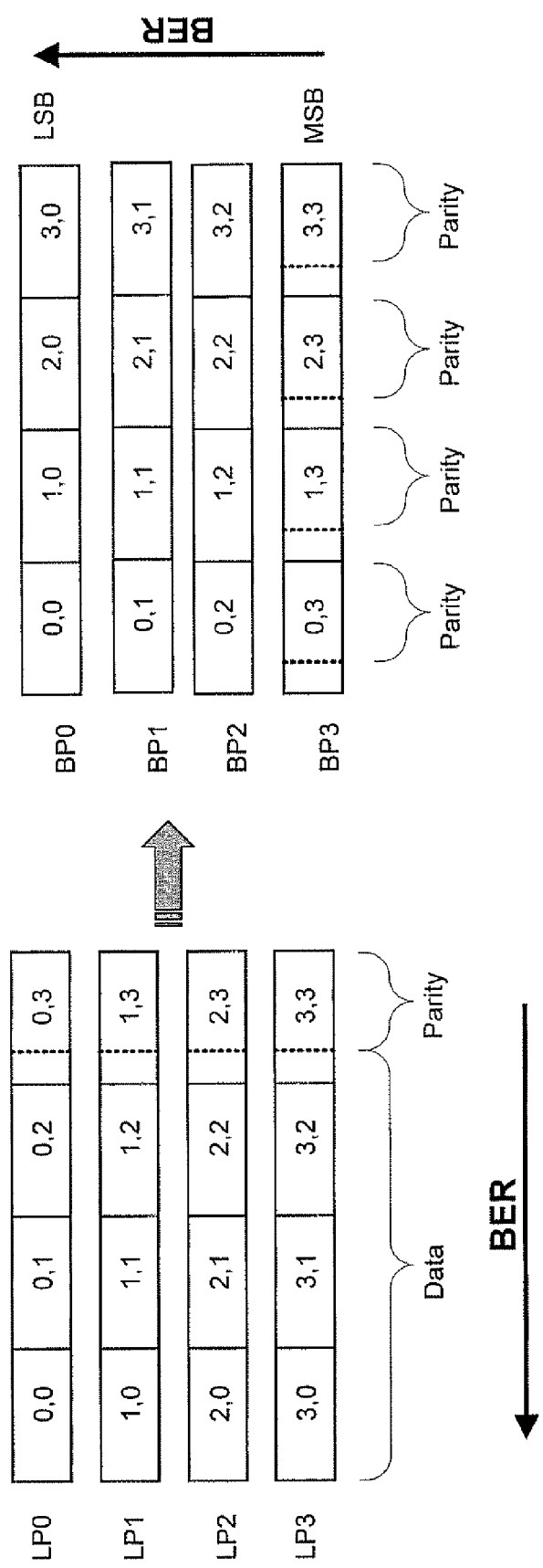

METHOD OF ARRANGING DATA IN A MULTI-LEVEL CELL MEMORY DEVICE

CROSS-REFERENCE TO RELATED APPLICATIONS

This patent application claims the benefit of U.S. Provisional Patent Application No. 60/759,396, filed Jan. 18, 2006.

FIELD OF THE INVENTION

The present invention relates to Multi-Level Cell Flash memory devices. More particularly, the invention relates to the field of Error Correction in a Multi-Level Cell Flash memory device.

BACKGROUND OF THE INVENTION

Flash memory devices have been known for many years. Within all Flash memory devices, NAND-type memories differ from other type memories (e.g. NOR), among other specific characteristics, by the fact that a number of information bits written to the memory may be read back in a "flipped" manner, i.e. different from way these bits have been originally written to the memory.

In order to overcome this phenomenon of obtaining "flipped" bits and to make NAND-type memories usable by real applications, it is a common technique to utilize ECC (Error Correction Code) algorithms in conjunction with these NAND-type memories. An ECC algorithm is typically employed by Flash memories as follows:

Before writing data to the memory, an ECC algorithm is applied to this data in order to compute additional (redundant) information bits. These redundant bits are often called "parity bits" or "parity" and are later used for error detection and correction. The combination of the original data and the parity is called a "codeword"

The entire codeword (i.e the original data and the parity) is recorded to the Flash memory device,. It should be noted that the actual size of the NAND Flash memory device is designed to accommodate the original data as well as the parity.

When the data is retrieved from the memory, the entire codeword is read and an ECC algorithm is applied to the data and the parity in order to detect and correct possible "bit flips" (i.e. errors).

It should be noted, that the implementation of the ECC algorithm may equally be obtained in hardware, in software or via a combination of hardware and software Furthermore, the ECC algorithm may be implemented within a memory device, within a memory device controller, within a host or may be "distributed" between these components of a system.

Flash memory devices may differ in the number of data elements (e.g. data bits) that are stored in each memory cell of the flash memory device. An SLC (Single Level cell) memory is operative to store a single bit in each memory cell, while an MLC (Multi Level Cell) memory is operative to store multiple bits in each memory cell.

In an MLC memory the manner of coding of voltage levels and the manner of assigning input data to the memory cells are of great importance for achieving an optimization of the ECC design.

A prior art method of storing data in multi-bit flash cells is taught by U.S. Application Publication No. 20060101193 to Murin. This patent application is incorporated by reference for all purposes as if fully set forth herein.

According to the Murin application, the optimal way (in the sense of ECC performance) in which input data is assigned to a physical page of a memory device is by interleaving these data bits between different bit-pages of a physical page, where a bit-page is defined as a group of bits, each one of which belongs to different cell of the physical page and all of which have the same significance within a cell (i.e. LSB, ..., MSB). Such way of arranging data in the memory device assures that data, which are retrieved from the memory device and then re-arranged in its original order (i.e. de-interleaved), shall have even (optimal) distribution of erroneous bits within it.

The interleaving process, as taught in the Murin application, assures that during the process of writing data to the memory device, input data of a logical page is equally spread among bit-pages of the physical memory page. In other words, the interleaving process assures that each bit-page of the physical page is assigned an equal number of bits from each one of the input data logical pages sharing this physical page.

Therefore, when the data is read out of the memory and de-interleaving is applied to these data, each one of the logical pages, created by the de-interleaving procedure, will contain equal share of bits from each one of the bit-pages of the physical page.

The manner of which an interleaving scheme is applied for assigning input data to a physical page of an MLC memory device is not specified in the art, since any scheme, which evenly distributes data in a physical page, is equally optimal in the sense of ECC performance.

However, for some ECC schemes additional benefits of saving processing time and power consumption may be achieved, using specific interleaving methods.

Therefore, when utilizing these ECC schemes it is desirable to provide an interleaving method for minimizing processing time and power consumption of prior art techniques.

SUMMARY OF THE INVENTION

Accordingly, it is a principal object of the present invention to provide a method of interleaving input data between different bit-pages of a physical page for minimizing processing time and power consumption of prior art techniques, when used in conjunction with specific ECC schemes.

Each of bit pages BP0, BP1, BP2, BP3 is defined herein in relation to a physical page of four bits per cell, such that bit page BP0 corresponds to the LSB physical page cells, bit page BP1 corresponds to the LSB−1 physical page cells, bit page BP2 corresponds to the LSB−2 physical page cells and bit page BP3 corresponds to the MSB physical page cells.

In accordance with a preferred embodiment of the present invention, there is provided a method of storing data that includes the steps of (a) storing a first portion of the data in bit positions of a non-volatile memory having a first probability of error; (b) storing a second portion of the data in bit positions of the non-volatile memory having a second probability of error, wherein the second probability of error is lower than the first probability of error; (c) storing error correction parity bits with the data; (d) reading the data and the error correction parity bits from the non-volatile memory; and (e) applying an error correction to the read data using the error correction parity bits, wherein at least one bit of the first portion is checked for correction before any bit of the second portion is checked for correction.

Preferably, the method also includes the step of stopping to apply the error correction before checking for correction of all the data.

Preferably, the method also includes the steps of determining a number of erroneous bits in the data; and stopping applying the error correction, in accordance with the number of erroneous bits, before checking for correction of all the data.

Preferably, the non-volatile memory is operative to store multiple bits per cell of the non-volatile memory.

In accordance with yet another preferred embodiment of the present invention, there is further provided a memory device that includes: (a) a non-volatile memory for storing data; and (b) a controller that is operative: (i) to store a first portion of the data in bit positions of the non-volatile memory having a first probability of error and at least a second portion of the data in bit positions of the non-volatile memory having a second probability of error, wherein the second probability of error is lower than the first probability of error; and (ii) the controller is also operative to apply an error correction to the data, using error correction parity bits, wherein at least one bit of the first portion is checked for correction before any bit of the second portion is checked for correction.

Preferably, the controller is also operative to stop execution of the error correction before checking for correction of all the data.

Preferably, the controller is also operative to determine a number of erroneous bits in the data; and to stop execution of the error correction in accordance with this number.

Preferably, the non-volatile memory is operative to store multiple bits per cell.

Preferably, the non-volatile memory is a flash memory.

In accordance with yet another preferred embodiment of the present invention, there is further provided a method of storing data that includes the steps of: (a) storing the data in a non-volatile memory; (b) storing error detection parity bits (of which may be obtained from a correctness check code applied to the data) with the data; (c) storing error correction parity bits with the data, separately from the error detection parity bits; (d) reading the data, the error detection parity bits and the error correction parity bits from the non-volatile memory; (e) applying an error correction to the data previously read using the error correction parity bits; and (f) in accordance with the error detection parity bits, stopping to apply the error correction after correcting all the data but before correcting any of the error correction parity bits.

Preferably, stopping to apply the error correction is effected only if the error detection parity bits indicate no errors exist in the data.

In accordance with yet another preferred embodiment of the present invention, there is further provided a memory device that includes: (a) a non-volatile memory for storing data; and (b) a controller that is operative: (i) to store, with the data, error correction parity bits and error detection parity bits, such that the error detection parity bits are separately stored from the error correction parity bits; (ii) to read the data, the error detection parity bits and the error correction parity bits from the non-volatile memory; and (iii) to apply an error correction to the data previously read, using the error correction parity bits and in accordance with the error detection parity bits, in a manner that stops the error correction scheme after correcting all the data but before correcting any of the error correction parity bits.

Preferably, the controller is also operative to stop the error, correction only if tile error detection parity bits indicate no errors exist in the data.

Preferably, the nonvolatile memory is operative to store multiple bits per cell.

Preferably, the non-volatile memory is a flash memory.

Additional features and advantages of the invention will become apparent from the following drawings and description.

BRIEF DESCRIPTION OF THE DRAWINGS

For a better understanding of the invention with regard to the embodiment thereof, reference is made to the accompanying drawings, in which like numerals designate corresponding sections or elements throughout, and in which:

FIG. 2A is an exemplary illustrative, non-limiting diagram of logical pages associated, by a host computer, to data bits of a 4-bit per cell memory device having a page of N cells; and FIG. 2B is an exemplary illustrative, non-limiting diagram of data bits written to bit pages of a physical page of the 4-bit per cell memory device of FIG. 2A, following an interleaving scheme of the present invention.

DETAILED DESCRIPTION OF THE PREFERRED EMBODIMENTS

Figure 1:
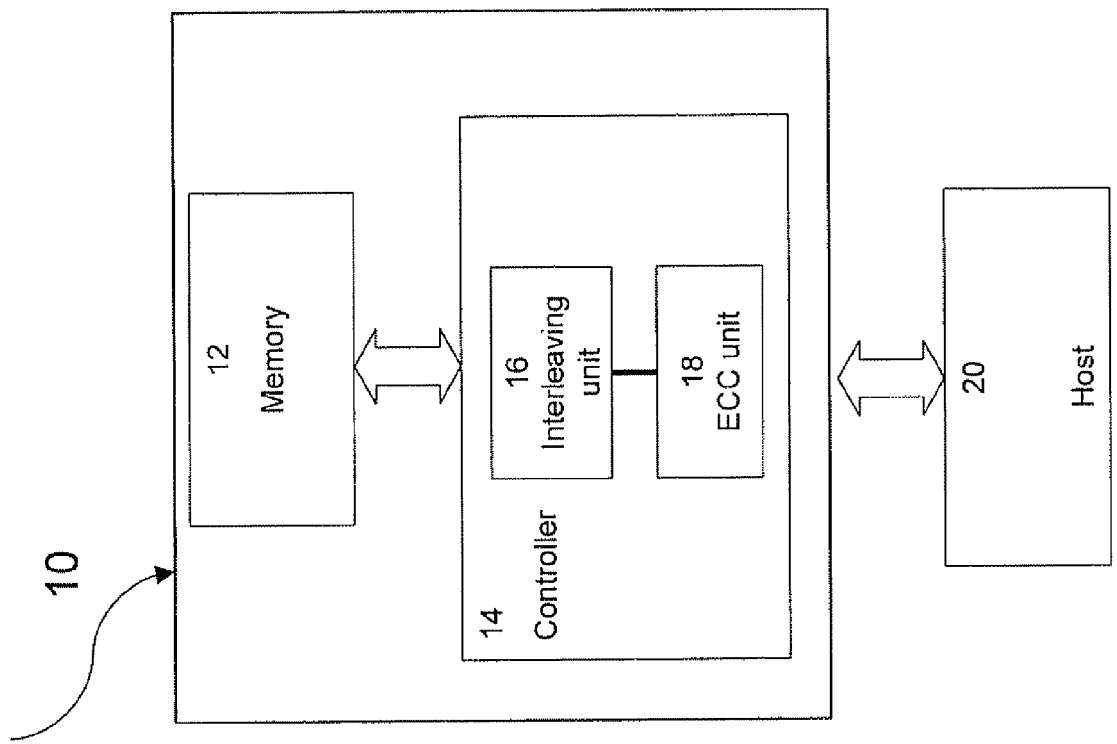
FIG. 1 is a block diagram of a system of the present invention.

The present invention is of a method of interleaving input data between different bit-pages of a physical page of an MLC memory device when used in conjunction with specific ECC algorithms in order to minimize processing time and power consumption of to prior art techniques.

Let us consider an ECC scheme, in which, in order to detect and correct "flipped" bits a search of all the data bits is required As an example for such a scheme, BCH decoding may be considered.

When implementing a BCH decoder for relatively large number of bit errors (generally, larger than 4), it is common to detect the data bits to be corrected using a "Chein Search". See for example, W. Wesley Peterson, E. J. Weldon, Jr., "*Error-Correcting Codes*", Second Edition, The Massachusetts Institute of Technology, 1972, which is incorporated by reference for all purposes as if fully set forth herein. The "Chein Search" does a bit scan of the codeword, checking whether or not a specific bit is an erroneous bit and, therefore, shall be flipped. But the total number of the erroneous bits in a codeword is limited by the codeword structure and is generally computed by the decoding algorithm stages, which precede "Chein Search". Therefore, the exact number of erroneous bits to be corrected can be determined by the ECC algorithm prior to the bit scanning of the code word (using "Chein Search").

As such, the bit scanning of the codeword may be stopped when all the erroneous bits have been detected and corrected, thus sparing the need to bit scan all the bits of a code word and saving processing time and power. The search may be stopped because one can be sure no more bits that are to be corrected will be found, as the algorithm had already found all erroneous bits.

Let us look now at the interleaving of the input data. As known in the art, the process of interleaving data assures that during the process of writing data to the memory, input data of a logical page is equally spread between bit-pages of a physical memory page. In other words, the interleaving process assures that each bit page of the physical page gets equal number of bits from each one of the input data logical pages sharing this physical page, or, that bits of input data logical pages are distributed in equal shares between all the bit-pages of a physical page.

Therefore, when the data is read out of the memory and a de-interleaving process is applied to these data, each one of the logical pages, created by the de-interleaving process, includes an equal share of bits from each one of the bit-pages of the physical page.

It is further known in the art, as taught in the Murin application, that each one of the bit-pages of a physical page has different probability of bit errors. This probability depends on a coding scheme of voltage levels implemented in the memory device. Using an example for implementing a three-bit per cell device with a voltage level coding of {7,6,4,5,1, 0,2,3}, one can see that the bit-pages of such a device have probabilities of bit error in accordance with the ratio of 1:2:4 (this ratio corresponds to number of bit changes in the level code for each bit-page), wherein the LSB (Least Significant Bit) page has four times the probability of the MSB (Most Significant Bit) page. Assuming that the total probability of error in a physical page is P, the bit-pages of the device have probabilities of P/7, 2*P/7 and 4*P/7 respectively, see the Murin application for details.

Following de-interleaving, each logical page includes bits having all kinds of probability of error in equal shares, such that one third of the bits will have a probability of error of P/7, one third of the bits will have a probability of error of 2*P/7 and one third of the bits will have a probability of error of 4*P/7. As such, different numbers of erroneous bits are statistically detected by the error correction algorithm in different portions of a logical page that are de-interleaved from different bit-pages of a physical page.

Now let us consider again the stage in the error correction algorithm, in which bits are scanned one after another, searching for errors. If the bits of a bit-page are scanned in an order of decreasing probability of error, then, on average, this process would detect all the errors in a logical page earlier than in other cases, thus saving time and power.

However, the bit scanning may most economically be implemented in a sequential way (i.e. from the first bit a logical page to the last bit of the logical page).

Accordingly, if the bit scanning starts from the beginning of a logical page, then the first portion of bits is to-be placed by the interleaving method of the present invention in an LSB bit-page of a physical page for greatest probability to have errors, the next portion of bits is to-be placed in the (LSB+1) bit-page, and so on. The last portion of the bits is to-be placed by the interleaving method of the present invention in the MSB bit-page of the physical page, providing for the smallest chance to have errors.

Most generally speaking, in case of an M-bit-per-cell device having a page of N cells, the interleaving method of the present invention is implemented as following:

For each input logical page:
$1^{st}$ portion of N/M bits ⇒ are placed by interleaving in the (LSB) bit-page of physical page,
$2^{nd}$ portion of N/M bits ⇒ are placed by interleaving in the (LSB+1) bit-page of physical page,
$M^{th}$ portion of N/M bits ⇒ are placed by interleaving in the (MSB) bit-page of physical page.

As such, the interleaving method the present invention is provided to assure that with a high probability typically all the erroneous bits are detected and corrected before the entire logical page is bit scanned, thereby achieving optimal processing time and power consumption.

Referring now to FIG. 1, there is shown a block diagram of a system 10 of the present invention A controller 14 is operative to manage the manner in which data bits received from a host 20 are interleaved and stored in a memory 12.

Interleaving unit 16 is implemented in accordance with the interleaving method of the present invention to apply interleaving to input data that are received from the host 20 and coded by an ECC unit 18.

Referring to FIG. 2A, there is shown an exemplary illustrative, non-limiting diagram of data bits associated with logical pages LP0, LP1, LP2, LP3 to be written to a 4-hit per cell memory device having a physical page of N cells. Each of logical pages LP0, LP1, LP2, LP3 includes four respective portions of bits, where the first index of each portion represents the logical page number and the second index represents the portion number.

Bit portions '0,0', '0,1', '0,2', '0,3' are associated to logical page LP0, bit portions '1,0', '1,1', '1,2', '1,3' are associated to logical page LP1, bit portions '2,0', '2,1', '2,2', '2,3' are associated to logical page LP2, and bit portions '3,0', '3,1', '3,2', '3,3' are associated to logical page LP3.

Typically, at least some bits within portions '0,3', '1,3', '2,3', '3,3' of logical pages LP0, LP1, LP2, LP3, respectively, include the parity bits of the data.

Referring to FIG. 2B, there is shown an exemplary illustrative, non-limiting, diagram of the data bits of FIG. 2A as written to bit pages BP0, BP1, BP2, BP3 of a physical page of a 4-bit per cell memory device, following an interleaving method of the present invention.

Following the interleaving method of the present invention, the data bits are written to the bit pages of the 4-bit per cell memory device as follows: bit portions '0,0', '1,0', '2,0', '3,0' are written to bit page BP0 (for greatest probability to have errors), bit portions '0,1', '1,1', '2,1', '3,1' are written to bit page BP1 (for second-greatest probability to have errors), bit portions '0,2', '1,2', '2,2', '3,2' are written to bit page BP2 (for third-greatest probability to have errors), and bit portions '0,3', '1,3', '2,3', '3,3' are written to bit page BP3 (for least probability to have errors).

Accordingly, at least some bits within portions '0,3', '1,3', '2,3', '3,3' of bit page BP3 include the parity bits of the data.

If the data bits are written to the memory device in accordance with the interleaving method of the present invention, then when the data bits are read back and de-interleaved, the data bits in each of logical pages LP0, LP1, LP2, LP3 are arranged in an order of decreasing probability of error, starting from a beginning of each logical page. Now, if Chein Search is applied to these logical pages (as a part of error correction procedure) from the beginning of a logical page, then on average all the erroneous bits are detected and corrected before reaching the end of the logical page. The Chein Search may be stopped at the last corrected bit, thus saving time and power.

It should be noted that the order of which any of the [N/4] bits, within each respective bit portion, are written in the memory device is not limited by the present invention.

It should be further noted, that independently of the interleaving method of the present invention and in addition to it, the bit scanning process effectiveness may be preferably and optionally enhanced by applying a simple correctness check code known in the art to the user data portion of the input codewords Such correctness check code may be a simple check-sum or a CRC (Cyclical Redundancy Check). If error detection parity bits that are obtained from a correctness check code are added to the user data bits of the input codeword prior to writing the user data bits to the memory device (in addition with the parity bits), then, while searching for errors, the bit scanning process may be stopped when all the user data bits are checked, even if not all the errors are detected in a logical page (that is—when some errors are in the parity bits rather than in the user data bits), provided that the correctness check code read from the memory device matches the correctness check code applied to the scanned user data bits.

Clearly, the time and power savings due to the utilizing of such error checking technique is more significant for cases with greater error probability, and hence with larger portion of parity bits in the codeword.

However, this procedure has the disadvantage of increasing the probability of errors misdetection in the user data bits, since there is still a certain probability (although minor) to have a match between the correctness check code read from the memory device and the correctness check code applied to the scanned user data bits and still have errors in the user data bits (this probability depends on a type and on the size of the correctness check code).

Having described the system of the present invention with regard to certain specific embodiments thereof it is to be understood that the description is not meant as a limitation, since further modifications will now suggest themselves to those skilled in the art, and it is intended to cover such modifications as fall within the scope of the appended claims.

The invention claimed is:

1. A method of storing data comprising the steps of:
   (a) storing a first portion of the data in bit positions of a non-volatile memory having a first probability of error;
   (b) storing a second portion of the data in bit positions of said non-volatile memory having a second probability of error, wherein said second probability of error is lower than said first probability of error;
   (c) storing error correction parity bits with the data;
   (d) reading the data and said error correction parity bits from said nonvolatile memory; and
   (e) applying an error correction to the read data using said error correction parity bits, wherein at least one bit of said first portion is checked for correction before any bit of said second portion is checked for correction.

2. The method of claim 1 further comprising the step of:
   (f) stopping said applying before checking for correction of all the data.

3. The method of claim 1 further comprising the steps of:
   (f) determining a number of erroneous bits in the data;
   (g) stopping said applying, in accordance with said number of erroneous bits, before checking for correction of all the data.

4. The method of claim 1, wherein said non-volatile memory is operative to store multiple bits per cell of said non-volatile memory.

5. A memory device comprising:
   (a) a non-volatile memory for storing data; and
   (b) a controller that is operative:
      (i) to store a first portion of said data in bit positions of the nonvolatile memory having a first probability of error and at least a second portion of said data in bit positions of the non-volatile memory having a second probability of error, wherein said second probability of error is lower than said first probability of error; and
      (ii) to apply an error correction to said data, using error correction parity bits, wherein at least one bit of said first portion is checked for correction before any bit of said second portion is checked for correction.

6. The memory device of claim 5, wherein said controller is further operative to stop said error correction before checking for correction of all said data.

7. The memory device of claim 5, wherein said controller is further operative to determine a number of erroneous bits in said data; and to stop said error correction in accordance with said number.

8. The memory device of claim 5, wherein said non-volatile memory is operative to store multiple bits per cell.

9. The memory device of claim 5, wherein said non-volatile memory is a flash memory.

10. A method of storing data comprising the steps of:
    (a) storing the data in a non-volatile memory;
    (b) storing error detection parity bits with the data;
    (c) storing error correction parity bits with the data, separately from said error detection parity bits;
    (d) reading the data, said error detection parity bits and said error correction parity bits from said non-volatile memory;
    (e) applying an error correction to said read data using said error correction parity bits; and
    (f) in accordance with said error detection parity bits, stopping said applying after correcting all the data but before correcting any of said error correction parity bits.

11. The method of claim 10, wherein said stopping is effected only if said error detection parity bits indicate no errors exist in the data.

12. A memory device comprising:
    (a) a non-volatile memory for storing data; and
    (b) a controller that is operative:
       (i) to store, with said data, error correction parity bits and error detection parity bits, such that said error detection parity bits are separately stored from said error correction parity bits;
       (ii) to read said data, said error detection parity bits and said error correction parity bits from said non-volatile memory; and
       (iii) to apply an error correction to said read data, using said error correction parity bits and in accordance with said error detection parity bits, in a manner that stops said error correction after correcting all said data but before correcting any of said error correction parity bits.

13. The memory device of claim 12, wherein controller is operative to stop said error correction only if said error detection parity bits indicate no errors exist in said data.

14. The memory device of claim 12, wherein said non-volatile memory is operative to store multiple bits per cell.

15. The memory device of claim 12, wherein said non-volatile memory is a flash memory.

* * * * *